(12) United States Patent
Wu et al.

(10) Patent No.: US 9,087,773 B2
(45) Date of Patent: Jul. 21, 2015

(54) IMPLANT REGION DEFINITION

(71) Applicant: Taiwan Semiconductor Manufacturing Company Limited, Hsin-Chu (TW)

(72) Inventors: Juing-Yi Wu, Hsinchu (TW); Jyh-Kang Ting, Baoshan Township (TW); Tsung-Chieh Tsai, Chu-Bei (TW); Liang-Yao Lee, Taoyuan (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/023,751

(22) Filed: Sep. 11, 2013

(65) Prior Publication Data

US 2015/0072480 A1 Mar. 12, 2015

(51) Int. Cl.
*H01L 21/00* (2006.01)
*H01L 21/265* (2006.01)
*H01L 29/36* (2006.01)

(52) U.S. Cl.
CPC .......... *H01L 21/26513* (2013.01); *H01L 29/36* (2013.01)

(58) Field of Classification Search
CPC .............. H01L 21/26513; H01L 29/36; H01L 21/26506
See application file for complete search history.

(56) References Cited

U.S. PATENT DOCUMENTS

| 5,300,454 | A | * | 4/1994 | Taft et al. | 438/234 |
| 5,668,020 | A | * | 9/1997 | Lee | 438/303 |
| 5,770,485 | A | * | 6/1998 | Gardner et al. | 438/162 |

\* cited by examiner

*Primary Examiner* — Richard Booth
(74) *Attorney, Agent, or Firm* — Cooper Legal Group, LLC (57) ABSTRACT

Among other things, one or more systems and techniques for defining one or more implant regions or for doping a semiconductor arrangement are provided. A first implant region is defined based upon a first implant mask overlaying a first active region of a semiconductor arrangement. A second implant region is defined based upon the first implant mask and a second implant mask overlaying a second active region of the semiconductor arrangement. A third implant region is defined based upon the second implant mask overlaying a third active region of the semiconductor arrangement. One or more doping processes are performed through the first implant mask and the second implant mask to dope the semiconductor arrangement. Because the first implant mask and the second implant mask overlap the second active region, doping area coverage is improved thus mitigating undesirable voltage threshold variations otherwise resulting from inadequate doping area coverage.

20 Claims, 10 Drawing Sheets

IMPLANT REGION DEFINITION

BACKGROUND

During lithography processing on a semiconductor wafer, a mask is used to transfer a pattern to a photoresist formed on the semiconductor wafer. For example, the pattern is formed in the mask and light passes through portions of the mask comprising the pattern. The photoresist is light sensitive such that the light passing through the mask transfers the pattern to the photoresist. Depending upon the type of photoresist used (positive or negative), the portions of the photoresist exposed to light become more or less soluble to a developer solution. In this way, the pattern (or a negative of the pattern) is transferred to the photoresist to create a patterned photoresist. An etching process or a material deposition process is performed through the patterned photoresist to either etch or form material on a layer of the semiconductor wafer over which the patterned photoresist is situated. After the lithography processing is complete, the patterned photoresist is removed from the semiconductor wafer.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more systems and techniques for defining implant regions or doping a semiconductor arrangement are provided. A semiconductor arrangement comprises one or more devices having various voltage thresholds Vts. During fabrication, a mask is used to define an implant region. The implant region is doped N-type or P-type according to a doping concentration. A voltage threshold for an implant region is based upon a doping concentration of that region. Thus, various masks and doping concentrations are used to define different voltage thresholds for devices within the semiconductor arrangement. As semiconductor arrangements become smaller, implant regions defined by masks do not adequately cover portions of devices that are to be doped, thus resulting in undesirable variations in voltage thresholds among such devices. Accordingly, as provided herein, one or more implant masks are used to define implant regions having improved coverage based upon overlap between two or more implant masks.

Figure 1:
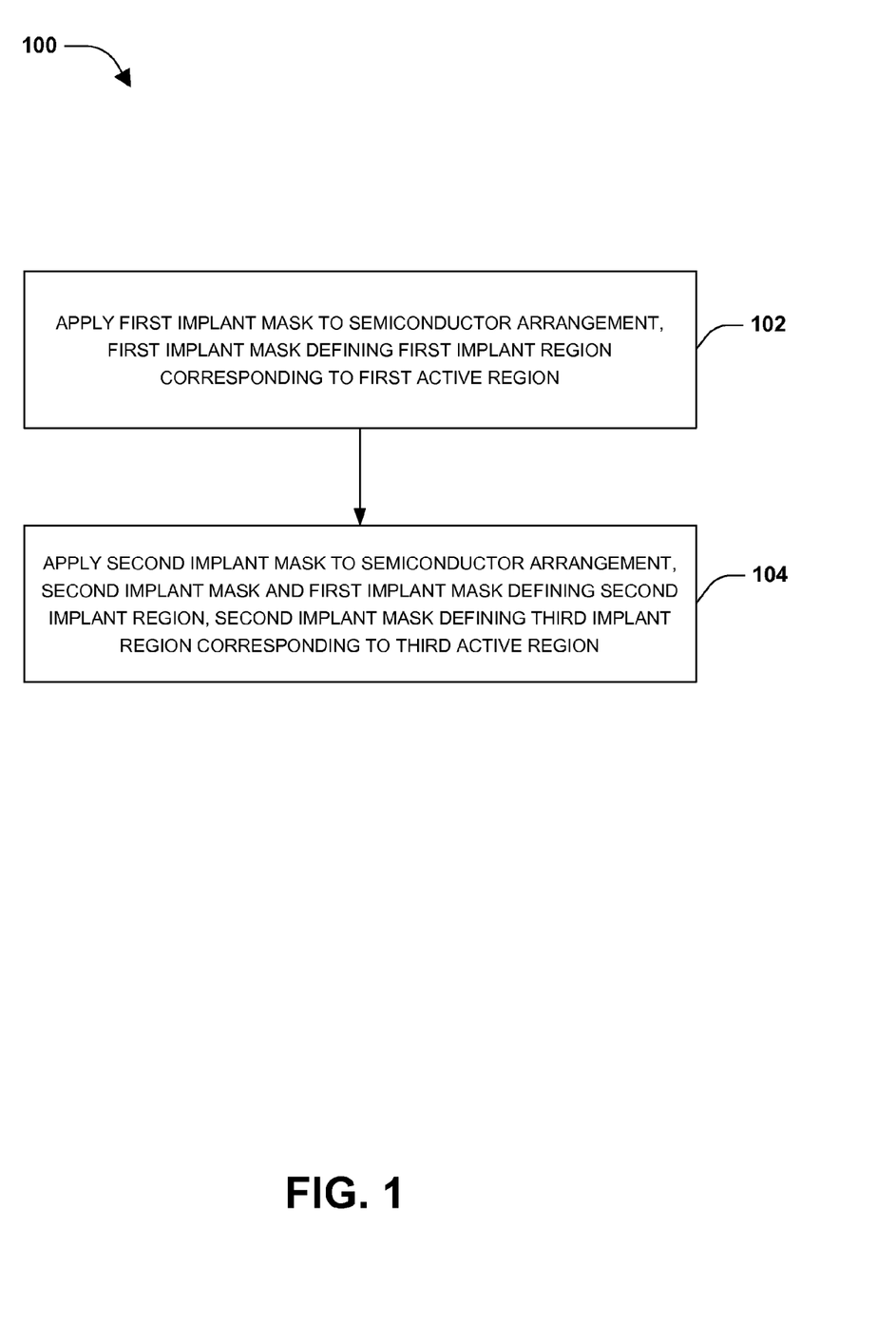
FIG. 1 is a flow diagram illustrating a method of defining one or more implants regions, according to some embodiments.

A method 100 of defining one or more implants regions is illustrated in FIG. 1. A semiconductor arrangement comprises one or more active regions, such as a first active region, a second active region, and a third active region. An active region comprises one or more active devices or portions thereof, such as one or more gates, source regions, or drain regions, as illustrated by active region 200 in FIG. 2. In an embodiment, the active region 200 comprises a first active device corresponding to a first source region 202, a first gate 204, and a first drain region 206. A shallow trench isolation (STI) structure separates the first active device from a second active device corresponding to a second drain region 210, a second gate 212, and a second source region 214. It is appreciated that in an embodiment an active region comprises any number of active devices or portions thereof, and that a semiconductor arrangement comprises any number of active regions.

At 102, a first implant mask is applied to the semiconductor arrangement. The first implant mask covers the first active region and the second active region. In an embodiment, the first active region is adjacent to the second active region. The first implant mask defines a first implant region corresponding to the first active region. In an embodiment, a first doping process is performed through the first implant mask. The first doping process applies a first doping concentration of dopants, such as N-type dopants or P-type dopants, to the first implant region resulting in the first active region having the first doping concentration. In an embodiment, a relatively high doping concentration is applied to the first implant region resulting in the first active region having a relatively high doping concentration and thus a relatively low voltage threshold. The first doping process applies the first doping concentration to the second active region resulting in the second active region initially having the first doping concentration such as the relatively high initial doping concentration. It is appreciated that in an embodiment, the first doping concentration of the second active region will be modified to a third doping concentration based upon a second doping process through a second implant mask overlaying the second active region such that the third doping concentration corresponds to the first doping concentration from the first doping process and a second doping concentration from the second doping process.

At 104, the second implant mask is applied to the semiconductor arrangement. The second implant mask covers the second active region and the third active region. The second implant mask and the first implant mask define a second implant region corresponding to an overlap between the first implant mask and the second implant mask over the second active region. The second implant mask defines a third implant region corresponding to the third active region. In an embodiment, the second doping process is performed through the second implant mask. The second doping process applies the second doping concentration, such as a relatively low doping concentration resulting in a relatively high voltage threshold, of dopants to the second implant region and the third implant region. Doping the third implant region with the second doping concentration results in the third active region having the second doping concentration, such as the relatively low doping concentration. Doping the second implant region with the second doping concentration results in the second active region having the third doping concentration corresponding to the first doping concentration and the second doping concentration. In an embodiment, the third doping concentration corresponds to a combination between the first doping concentration and the second doping concentration, such as a concentration between the relatively low doping concentration and the relatively high doping concentration. In an embodiment, the third doping concentration corresponds to an accumulation of the first doping concentration and the second doping concentration, such as a doping concentration greater than the relatively high doping concentration. In this way, the second active region has the third doping concentration based upon the first doping process through the first implant mask and the second doping process through the second implant mask.

In an embodiment, one or more doping processes are performed such that the first implant region, the second implant region, and the third implant region are doped with varying concentrations of dopants, and thus have different voltage thresholds. In an embodiment, the first implant mask and the second implant mask overlap one or more additional active regions, such as a fourth active region. The first implant mask and the second implant mask define a fourth implant region corresponding to the fourth active region. The first doping process, through the first implant mask, and the second doping process, through the second implant mask, result in the fourth implant region having the third doping concentration corresponding to the first doping concentration of the first doping process and the second doping concentration of the second doping process. In an embodiment, the first implant mask and the second implant mask are formed as two overlapping shapes, such as a first ellipse that overlaps a second ellipse. Because the first implant mask and the second implant mask overlap, relatively more active region area is doped by at least one of the first doping process and the second doping process resulting in more uniform voltage thresholds, stable voltage thresholds, cost and mask reduction, improved doping coverage, etc.

Figure 2:
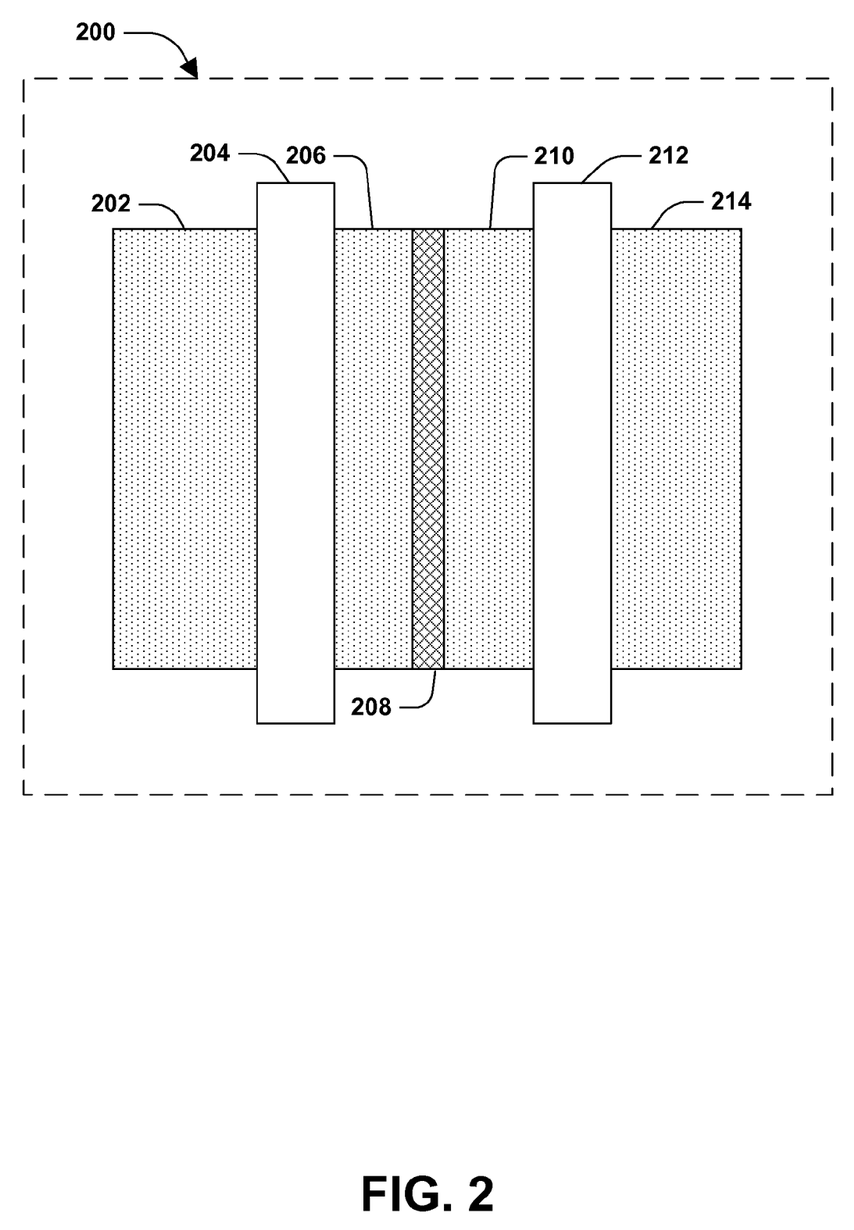
FIG. 2 is an illustration of an active region, according to some embodiments.
Figure 3A:
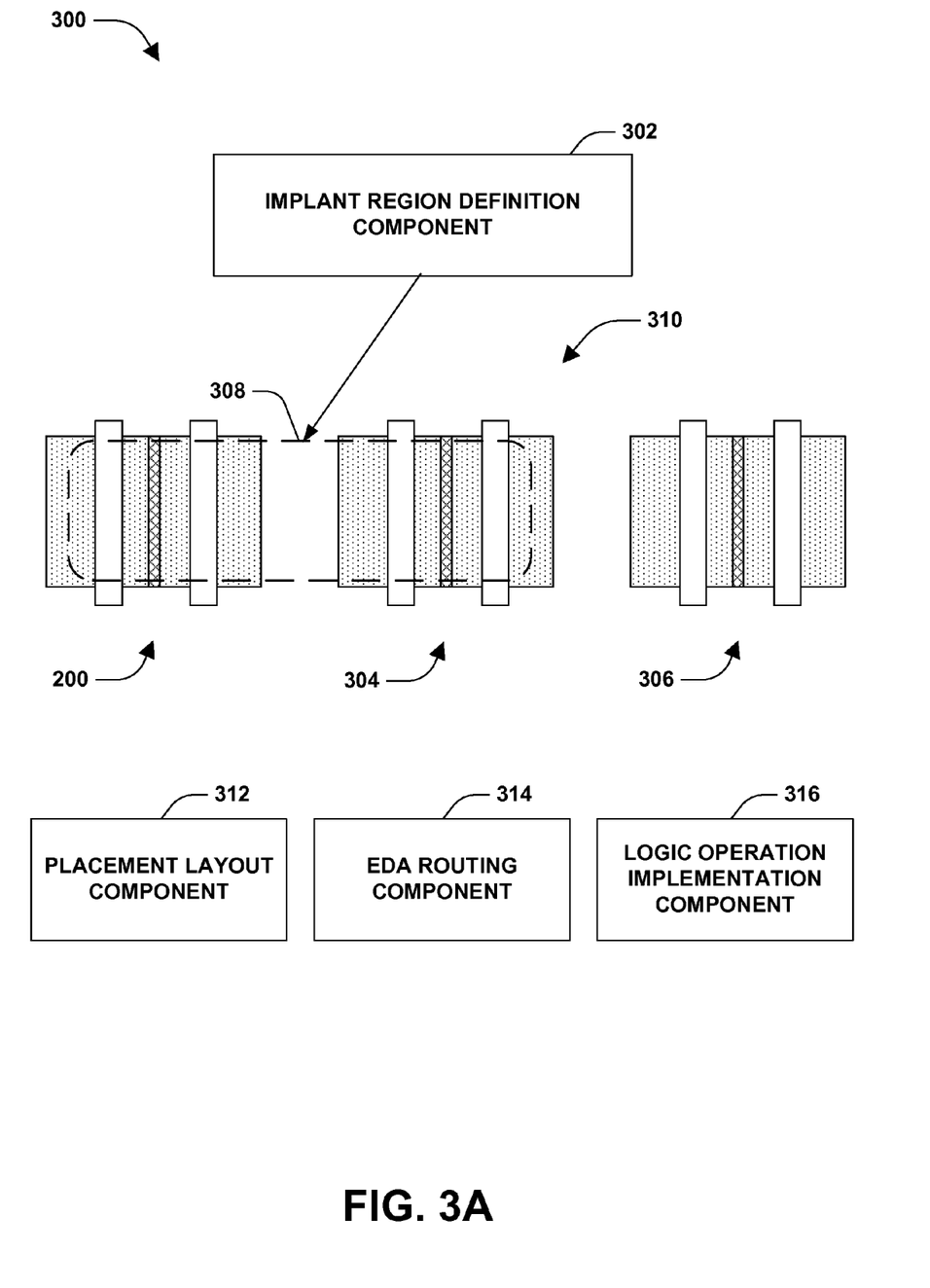
FIG. 3A is an illustration of a system for defining one or more implant regions, according to some embodiments.

FIG. 3A illustrates a system 300 for defining one or more implant regions. The system 300 comprises an implant region definition component 302 associated with a semiconductor arrangement 310. The semiconductor arrangement 310 comprises a first active region 200 as illustrated in FIG. 2, a second active region 304, and a third active region 306. The implant region definition component 302 is configured to apply a first implant mask 308 to the semiconductor arrangement 310. The first implant mask 308 overlays at least a portion of the first active region 200 and at least a portion of the second active region 304.

Figure 3B:
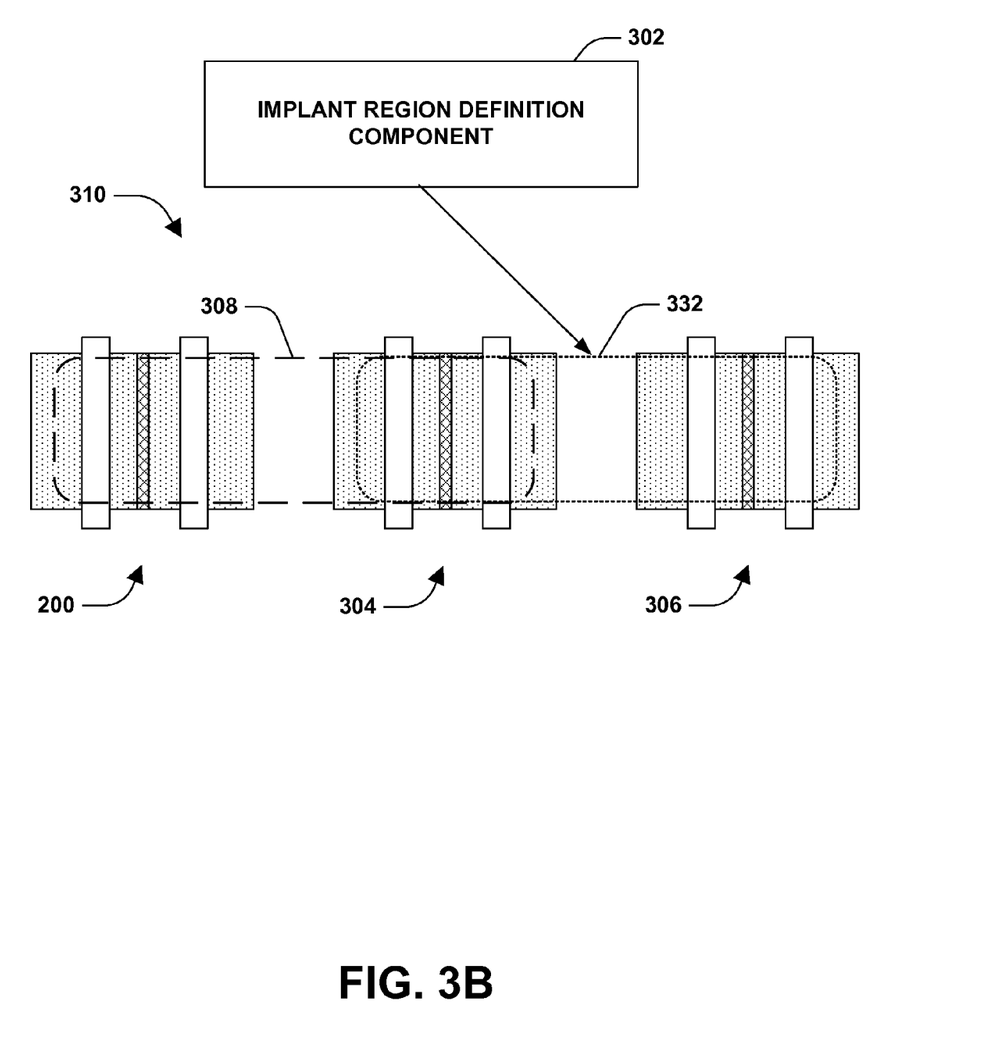
FIG. 3B is an illustration of applying a second implant mask to a semiconductor arrangement, according to some embodiments.
Figure 3C:
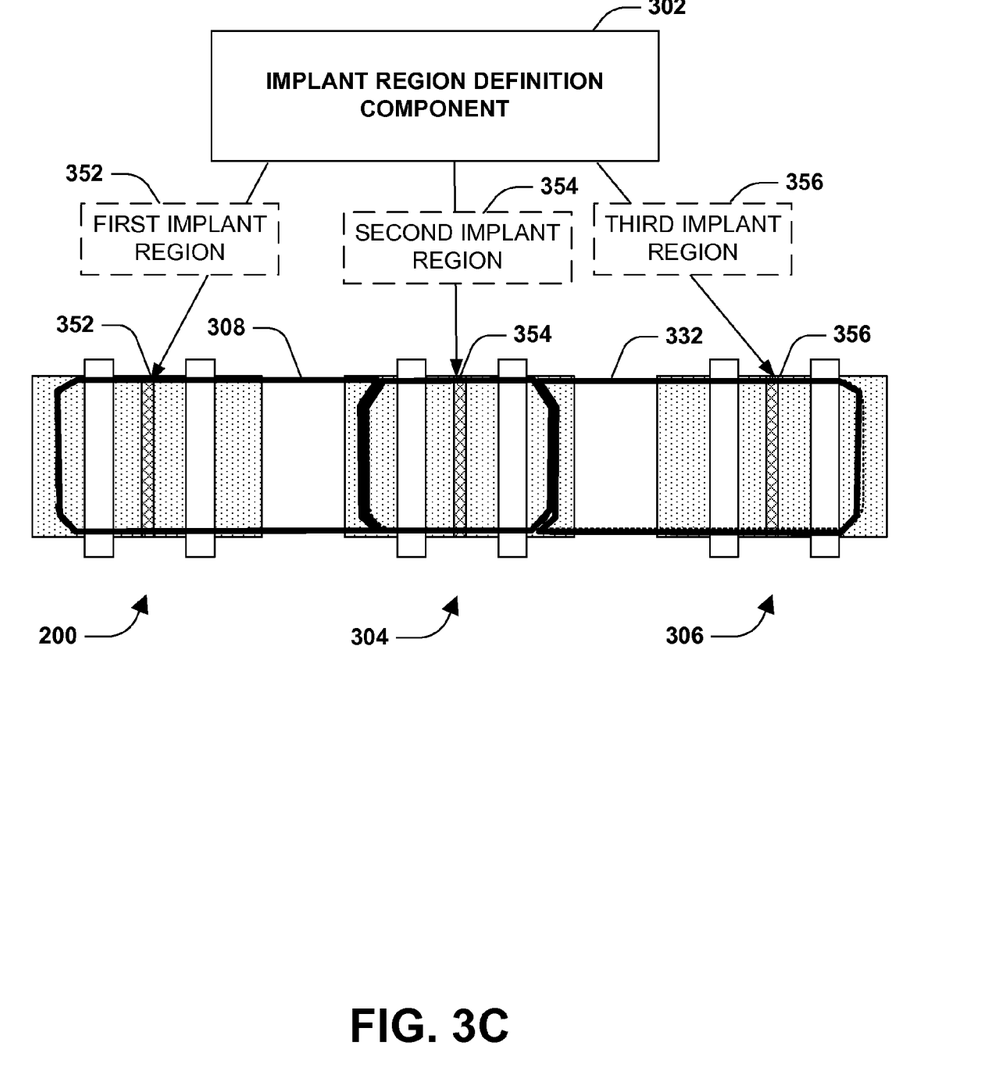
FIG. 3C is an illustration of a first implant region, a second implant region, and a third implant region, according to some embodiments.

The implant region definition component 302 is configured to apply a second implant mask 332 to the semiconductor arrangement 310, as illustrated in FIG. 3B. The second implant mask 332 overlays at least a portion of the third active region 306 and at least a portion of the second active region 304. The first implant mask 308 and the second implant mask 332 overlap a portion of the second active region 304. In this way, one or more implant regions are defined by the first implant mask 308 and the second implant mask 332, as illustrated in FIG. 3C. A first implant region 352 corresponds to the first active region 200 covered by the first implant mask 308, such that the first implant region 352 is doped with a first doping concentration during a first doping process through the first implant mask 308 (e.g., first doping process 374 of FIG. 3D). A third implant region 356 corresponds to the third active region 306 covered by the second implant mask 332, such that the third implant region 352 is doped with a second doping concentration during a second doping process through the second implant mask 332 (e.g., second doping process 382 of FIG. 3E). A second implant region 354 corresponds to the second active region 304 covered by an overlap between the first implant mask 308 and the second implant mask 332, such that the second implant region 354 is doped with a third doping concentration corresponding to the first doping concentration provided during the first doping process through the first implant mask 308 and the second doping concentration provided during the second doping process through the second implant mask 332.

Figure 3D:
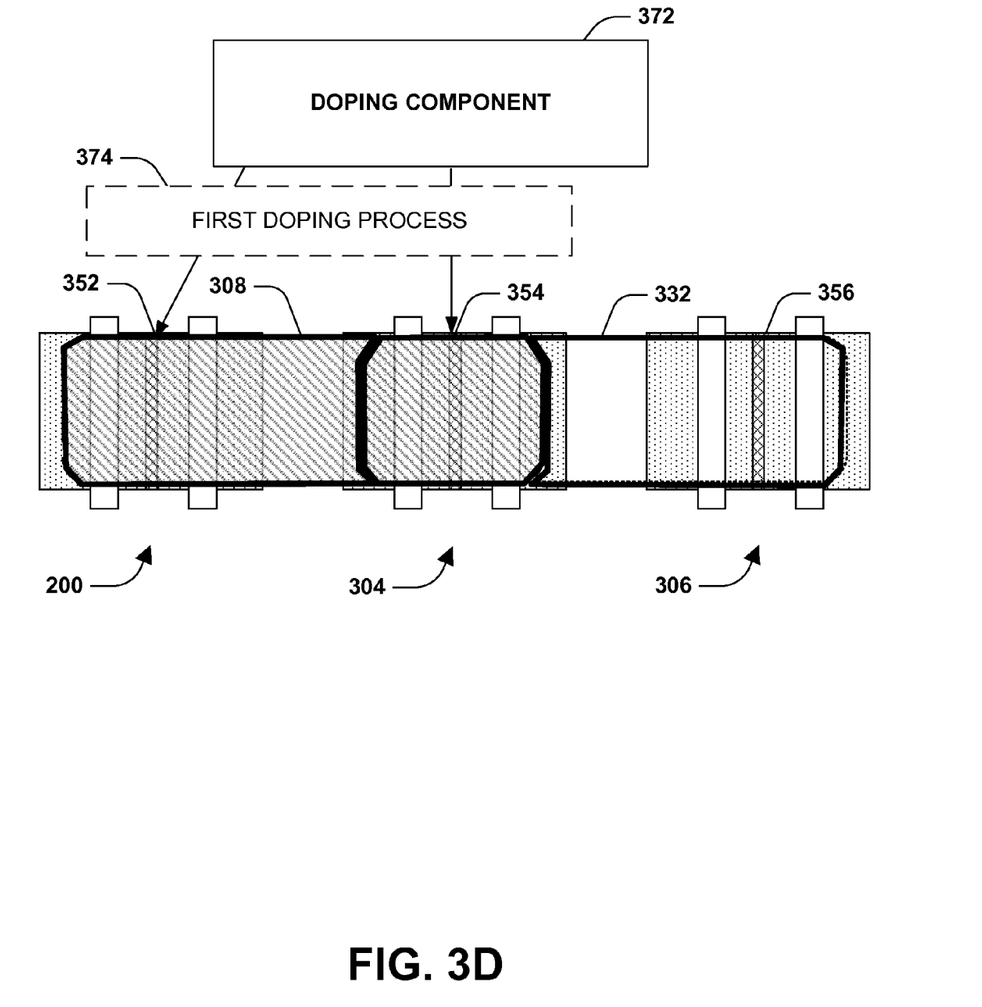
FIG. 3D is an illustration of doping a first implant region and a second implant region during a first doping process, according to some embodiments.
Figure 3E:
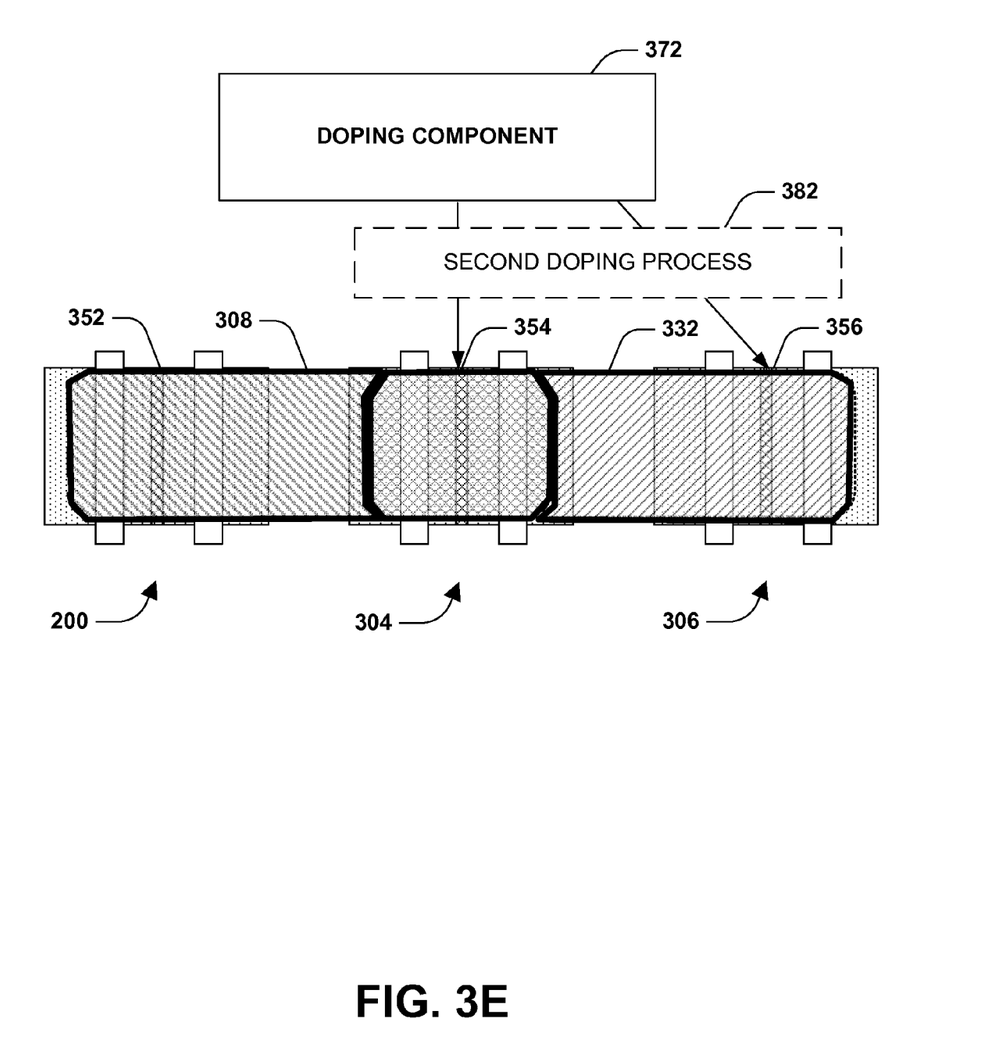
FIG. 3E is an illustration of doping a second implant region and a third implant region during a second doping process, according to some embodiments.
Figure 3F:
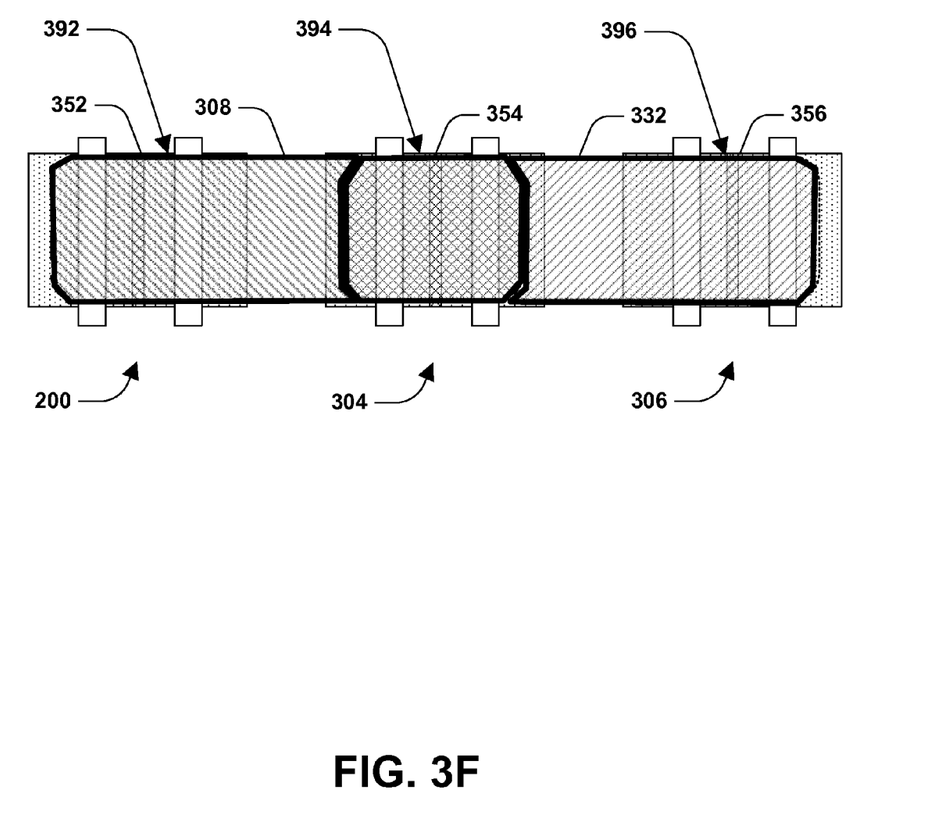
FIG. 3F is an illustration of a first implant region having a first doping concentration, a second implant region having a third doping concentration, and a third implant region having a second doping concentration, according to some embodiments.

In an embodiment, the system 300 comprises a doping component 372, as illustrated in FIG. 3D. The doping component 372 is configured to perform the first doping process 374 through the first implant mask 308. The first doping process 374 applies a first doping concentration to the first implant region 352 and the second implant region 354. In this way, the first active region 200, within the first implant region 352, is doped with the first doping concentration. The second active region 304, within the second implant region 354, is initially doped with the first doping concentration, which is modified by a second doping process 382 illustrated in FIG. 3E. The doping component 372 is configured to perform the second doping process 382 through the second implant mask 332, as illustrated in FIG. 3E. The second doping process 382 applies a second doping concentration to the second implant region 354 and the third implant region 356. In this way, the third active region 306, within the third implant region 356, is doped with the second doping concentration. The second active region 304, within the second implant region 354 and initially having the first doping concentration, is doped with the second doping concentration resulting in the second active 304 region having a third doping concentration corresponding to the first doping concentration and the second doping concentration. In this way, the first implant region 352, defined for the first active region 200, has a first doping concentration 392, as illustrated in FIG. 3F. The third implant region 356, defined for the third active region 306, has the second doping concentration 396. The second implant region 354, defined for the second active region 304, has the third doping concentration 394 corresponding to the first doping concentration 392 and the second doping concentration 396.

In an embodiment, the first implant region 352 has a first voltage threshold based upon the first doping concentration 392. The third implant region 356 has a second voltage threshold based upon the second doping concentration 396. In an embodiment, the second voltage threshold is different than the first voltage threshold. The second implant region 354 has a third voltage threshold based upon the third doping concentration 394. In an embodiment, the third voltage threshold has a voltage threshold value relatively similar a voltage threshold value of the first voltage threshold, such as the same voltage threshold value. In an embodiment, the third voltage threshold has a voltage threshold value relatively similar to a voltage threshold value of the second voltage threshold, such as the same voltage threshold value. In this way, three implant regions, such as the first implant region 352, the second implant region 354, and the third implant region 356, have two different voltage threshold values where the second implant region 354 has a voltage threshold value similar to either the first implant region 352 or the third implant region 356. In an embodiment, a logical operation is implemented through at least one of the first implant mask or the second implant mask to adjust the third voltage threshold of the second implant region 354 to either the first voltage threshold of the first implant region 352 or the second voltage threshold of the third implant region 356. In an embodiment, a gate length, a channel length, or other parameter is controlled to adjust the third voltage threshold of the second implant region 354 to either the first voltage threshold of the first implant region 352 or the second voltage threshold of the third implant region 356.

Figure 4:
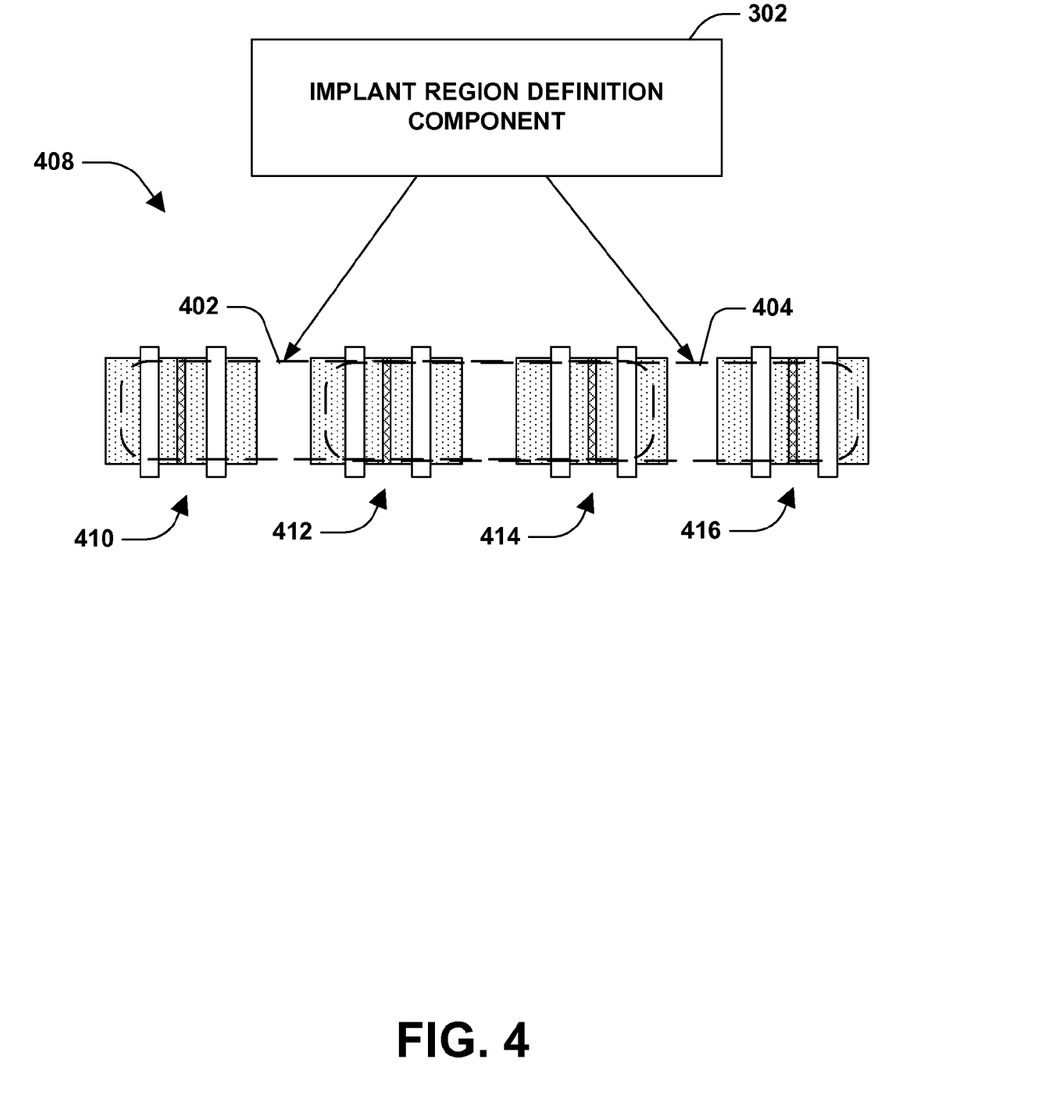
FIG. 4 is an illustration of a first implant mask and a second implant mask, according to some embodiments.

FIG. 4 illustrates a first implant mask 402 overlapping a second implant mask 404. The implant region definition component 302 applies the first implant mask 402 to a semiconductor arrangement 408. The semiconductor arrangement 408 comprises a first active region 410, a second active region 412, a third active region 414, and a fourth active region 416. The first implant mask 402 overlays at least a portion of the first active region 410, at least a portion of the second active region 412, and at least a portion of the third active region 414. The implant region definition component 302 applies the second implant mask 404 to the semiconductor arrangement 408. The second implant mask 404 overlays at least a portion of the second active region 412, at least a portion of the third active region 414, and at least a portion of the fourth active region 416. In this way, the first implant mask 402 and the second implant mask 404 overlap at least some of the second active region 412 and the third active region 414.

A first doping process, through the first implant mask 402, applies a first doping concentration to the first active region 410, the second active region 412, and the third active region 414. A second doping process, through the second implant mask 404, applies a second doping concentration to the second active region 412, the third active region 414, and the fourth active region 416. The first active 410 region has the first doping concentration based upon the first doping process. The fourth active region 416 has the second doping concentration based upon the second doping process. The second active region 412 and the third active region 414 have a third doping concentration based upon the first doping process and the second doping process due to the overlap in the first implant mask 402 and the second implant mask 404.

Figure 5:
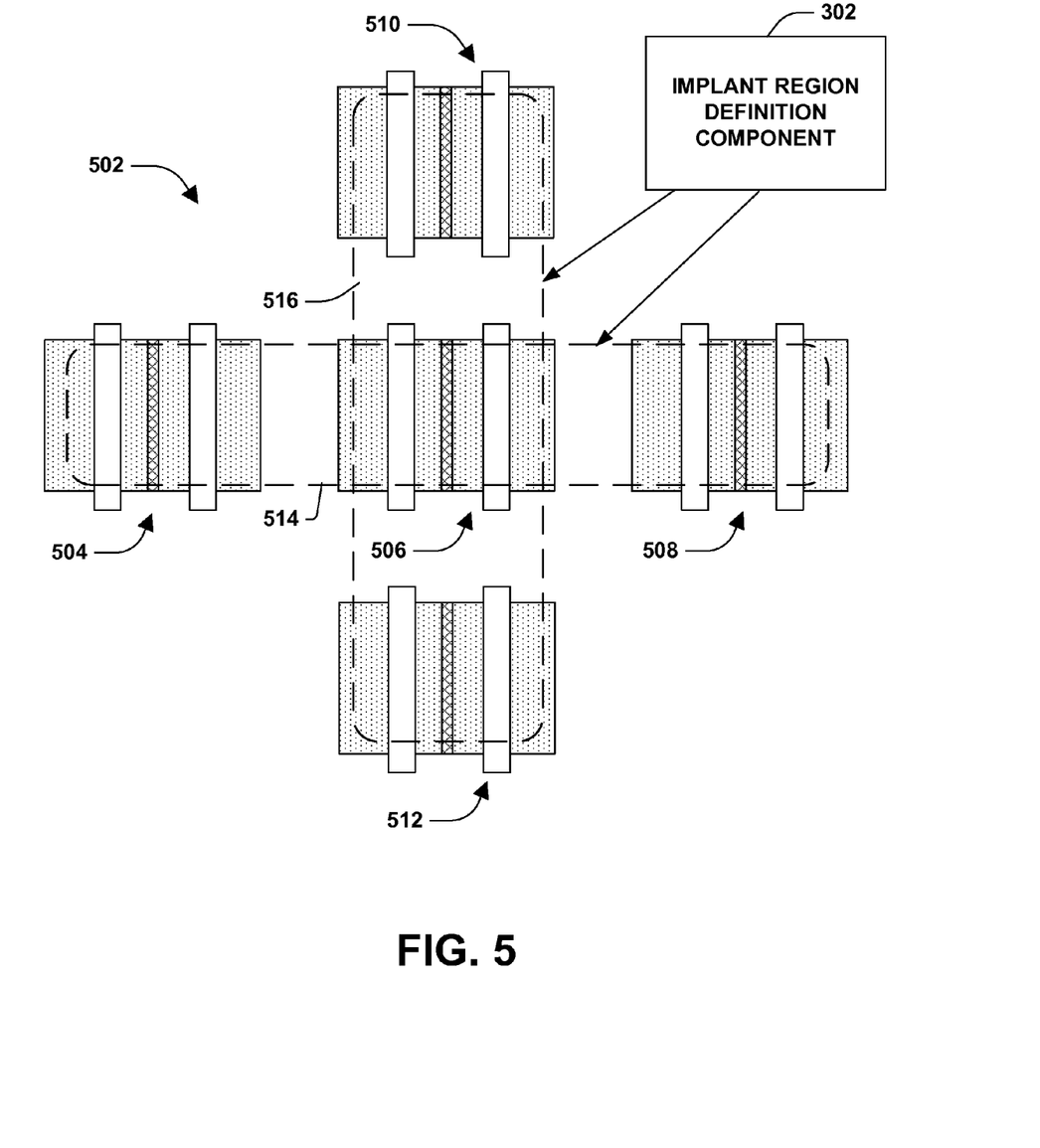
FIG. 5 is an illustration of a first implant mask and a second implant mask, according to some embodiments.

FIG. 5 illustrates a first implant mask 514 overlapping a second implant mask 516. The implant region definition component 302 applies the first implant mask 514 to a semiconductor arrangement 502. The semiconductor arrangement 502 comprises a first active region 504, a second active region 506, a third active region 508, a fourth active region 510, and a fifth active region 512. The first implant mask 514 overlays at least a portion of the first active region 504, at least a portion of the second active region 506, and at least a portion of the third active region 508. The implant region definition component 302 applies the second implant mask 516 to the semiconductor arrangement 502. The second implant mask 516 overlays at least a portion of the fourth active region 510, at least a portion of the second active region 506, and at least a portion of the fifth active region 512. In this way, the first implant mask 514 and the second implant mask 516 overlap at least some of the second active region 506.

A first doping process, through the first implant mask 514, applies a first doping concentration to the first active region 504, the second active region 506, and the third active region 508. A second doping process, through the second implant mask 516, applies a second doping concentration to the fourth active region 510, the second active region 506, and the fifth active region 512. The first active region 504 and the third active region 508 have the first doping concentration based upon the first doping process. The fourth active region 510 and the fifth active region 512 have the second doping concentration based upon the second doping process. The second active region 506 has a third doping concentration based upon the first doping process and the second doping process due to the overlap in the first implant mask 514 and the second implant mask 516. Overlapping implant masks allow for a degree of coverage that is greater than a degree of coverage where implant masks are non-overlapping.

In an embodiment, the system 300 comprises a placement layout component 312 configured to determine placement locations for at least one of the first active region, the second active region, or the third active region within a semiconductor arrangement. In an embodiment, the system 300 comprises an electronic design automation (EDA) routing component 314 configured to connect one or more active regions corresponding to a net. In an embodiment, the system 300 comprises a logic operation implementation component 316 configured to implement a logic function for specifying voltage thresholds for at least one of the first active region, the second active region, or the third active region According to an aspect of the instant disclosure, a method for defining one or more implant regions is provided. The method comprises applying a first implant mask to a semiconductor arrangement. The first implant mask covers a first active region and a second active region. The first implant mask defines a first implant region corresponding to the first active region. A second implant mask is applied to the semiconductor arrangement. The second implant mask covers a third active region and the second active region. The second implant mask and the first implant mask define a second implant region corresponding to an overlap between the first implant mask and the second implant mask over the second active region. The second implant mask defines a third implant region corresponding to the third active region.

According to an aspect of the instant disclosure, a system for defining one or more implant regions is provided. The system comprises an implant region definition component configured to define a first implant region based upon a first implant mask overlaying a first active region. The implant region definition component defines a second implant region based upon the first implant mask and a second implant mask overlaying a second active region. The implant region definition component defines a third implant region based upon the second implant mask overlaying a third active region.

According to an aspect of the instant disclosure, a system for doping a semiconductor arrangement is provided. The system comprises a doping component configured to dope a first implant region, through a first implant mask, to a first doping concentration during a first doping process. The first implant region has a first voltage threshold based upon the first doping concentration. The doping component dopes a third implant region, through a second implant mask, to a second doping concentration during a second doping process. The third implant region has a second voltage threshold based upon the second doping concentration. In an embodiment, the second voltage threshold is different than the first voltage threshold. The doping component dopes a second implant region, through the first implant mask during the first doping process and through the second implant mask during the second doping process, to a third doping concentration. The second implant region has a third voltage threshold based upon the third doping concentration. The third voltage threshold corresponds to the first voltage threshold or the second voltage threshold.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for defining one or more implant regions, comprising:
   applying a first implant mask to a semiconductor arrangement, the first implant mask covering a first active region and a second active region, the first implant mask defining a first implant region corresponding to the first active region; and
   applying a second implant mask to the semiconductor arrangement, the second implant mask covering a third active region and the second active region, the second implant mask and the first implant mask defining a second implant region corresponding to an overlap between the first implant mask and the second implant mask over the second active region, the second implant mask defining a third implant region corresponding to the third active region.

2. The method of claim 1, comprising:
   performing a first doping process through the first implant mask, the first doping process applying a first doping concentration to the first implant region, the first doping process applying the first doping concentration to the second implant region.

3. The method of claim 2, comprising:
   performing a second doping process through the second implant mask, the second doping process applying a second doping concentration to the third implant region, the second doping processing applying the second doping concentration to the second implant region resulting in a third doping concentration for the second implant region, the third doping concentration corresponding to a combination of the first doping concentration and the second doping concentration.

4. The method of claim 1, comprising:
   performing one or more doping processes resulting in a first doping concentration for the first implant region, a second doping concentration for the second implant region, and a third doping concentration for the third implant region.

5. The method of claim 4, the first doping concentration corresponding to a first voltage threshold, the second doping concentration corresponding to a second voltage threshold, and the third doping concentration corresponding to a third voltage threshold.

6. The method of claim 1, the applying a first implant mask comprising:
   applying the first implant mask over a fourth active region adjacent to the second active region, the first implant region corresponding to the fourth active region.

7. The method of claim 6, the applying a second implant mask comprising:
   overlying the second implant mask over the fourth active region, the first implant mask and the second implant mask defining the second implant region to correspond to the fourth active region.

8. The method of claim 1, the first active region comprising at least one of a source region or a drain region.

9. The method of claim 1, comprising:
   forming the first implant mask as a first ellipse; and
   forming the second implant mask as a second ellipse that overlaps the first ellipse.

10. A method for defining one or more implant regions, comprising:
- defining a first implant region based upon a first implant mask overlaying a first active region;
- defining a second implant region based upon the first implant mask and a second implant mask overlaying a second active region; and
- defining a third implant region based upon the second implant mask overlaying a third active region.

11. The method of claim 10, comprising:
- doping the first implant region, through the first implant mask, to a first doping concentration during a first doping process;
- doping the third implant region, through the second implant mask, to a second doping concentration during a second doping process; and
- doping the second implant region, through the first implant mask during the first doping processing and through the second implant mask during the second doping process, to a third doping concentration.

12. The method of claim 11, the third doping concentration larger than at least one of the first doping concentration or the second doping concentration.

13. The method of claim 11, the first doping concentration corresponding to a first voltage threshold, the second doping concentration corresponding to a second voltage threshold, and the third doping concentration corresponding to a third voltage threshold.

14. The method of claim 10, comprising:
- determining placement locations for at least one of the first active region, the second active region, or the third active region within a semiconductor arrangement.

15. The method of claim 10, comprising:
- defining the second implant region based upon the first implant mask and the second implant mask overlaying a fourth active region.

16. The method of claim 11, comprising:
- define the second implant region based upon the first implant mask and the second implant mask overlaying a fourth active region; and
- doping the fourth active region, through the first implant mask during the first doping processing and through the second implant mask during the second doping process, to the third doping concentration.

17. A method for doping a semiconductor arrangement, comprising:
- doping a first implant region, through a first implant mask, to a first doping concentration during a first doping process, the first implant region having a first voltage threshold based upon the first doping concentration;
- doping a third implant region, through a second implant mask, to a second doping concentration during a second doping process, the third implant region having a second voltage threshold, different than the first voltage threshold, based upon the second doping concentration; and
- doping a second implant region, through the first implant mask during the first doping processing and through the second implant mask during the second doping process, to a third doping concentration, the second implant region having a third voltage threshold based upon the third doping concentration, the third voltage threshold corresponding to the first voltage threshold or the second voltage threshold.

18. The method of claim 17, wherein a voltage threshold value of the third voltage threshold corresponds to a voltage threshold value of the first voltage threshold or a voltage threshold value of the second voltage threshold.

19. The method of claim 17, wherein a gate length is controlled so that a voltage threshold value of the third voltage threshold corresponds to a voltage threshold value of the first voltage threshold or a voltage threshold value of the second voltage threshold.

20. The method of claim 17, wherein a channel length is controlled so that a voltage threshold value of the third voltage threshold corresponds to a voltage threshold value of the first voltage threshold or a voltage threshold value of the second voltage threshold.

* * * * *